US011231459B2

(12) United States Patent
Giust (10) Patent No.: US 11,231,459 B2
(45) Date of Patent: Jan. 25, 2022

(54) METHOD AND APPARATUS FOR ANALYZING PHASE NOISE IN A SIGNAL FROM AN ELECTRONIC DEVICE

(71) Applicant: JitterLabs LLC, Santa Clara, CA (US)

(72) Inventor: Gary Giust, Santa Clara, CA (US)

(73) Assignee: JitterLabs LLC, Santa Clara, CA (US)

( * ) Notice: Subject to any disclaimer, the term of this patent is extended or adjusted under 35 U.S.C. 154(b) by 0 days.

(21) Appl. No.: 17/064,382

(22) Filed: Oct. 6, 2020

(65) Prior Publication Data

US 2021/0033670 A1 Feb. 4, 2021

Related U.S. Application Data (63) Continuation of application No. 16/210,229, filed on Dec. 5, 2018, now Pat. No. 10,802,074.

(60) Provisional application No. 62/612,987, filed on Jan. 2, 2018.

(51) Int. Cl.
*G01R 31/317* (2006.01)

(52) U.S. Cl.
CPC .............. *G01R 31/31709* (2013.01)

(58) Field of Classification Search
CPC .............. G01R 31/31709; G06Q 50/00
USPC ............... 324/76.21, 76.19, 76.12, 76.11
See application file for complete search history.

(56) References Cited

U.S. PATENT DOCUMENTS

| | | | | |
|---|---|---|---|---|
| 2007/0203659 A1* | 8/2007 | Yamaguchi | ...... | G01R 31/31709 702/69 |
| 2009/0237072 A1* | 9/2009 | Nelson | ...... | G01R 29/26 324/121 R |
| 2019/0204386 A1* | 7/2019 | Giust | ...... | G01R 31/31709 |

* cited by examiner

*Primary Examiner* — Giovanni Astacio-Oquendo
(74) *Attorney, Agent, or Firm* — Daniel A. Tysver; James M. Urzedwoski; Forsgren Fisher (57) ABSTRACT

An apparatus and method for analyzing phase noise in a signal. A plurality of signal samples, each signal sample representing a value of phase noise in a signal-under-test at a corresponding offset frequency, and filter data representing filter characteristics on a first side of a spectrum boundary, are used to derive filtered signal samples. A measure of noise is derived from the filtered signal samples. This abstract is not to be considered limiting, since other embodiments may deviate from the features described in this abstract.

24 Claims, 8 Drawing Sheets

METHOD AND APPARATUS FOR ANALYZING PHASE NOISE IN A SIGNAL FROM AN ELECTRONIC DEVICE

CROSS-REFERENCE TO RELATED CASES

This application is a continuation of U.S. application Ser. No. 16/210,229, filed on Dec. 5, 2018 (the '229 application). The '229 application claims the benefit of U.S. Provisional Application No. 62/612,987, filed on Jan. 2, 2018. All of these related cases are incorporated herein by reference in their entireties.

FIELD OF THE INVENTION

The subject matter disclosed herein relates generally to methods and apparatuses for analyzing a signal, and specifically to methods and apparatuses for analyzing phase noise in a signal derived from an electronic device.

SUMMARY

Phase noise may be defined as the frequency-domain representation of short-term phase fluctuations in a signal. Since it can limit the performance of many application systems, phase noise is a key metric for various components used in a signal chain, such as oscillators, synthesizers, buffers, phase-locked loops, and amplifiers. Properly accounting for phase noise as it propagates through the signal chain can help identify and reduce sources of phase noise in an application system, and lead to technology advancements.

DETAILED DESCRIPTION

Definitions

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings. Nothing in this document is intended to be construed as an admission of prior art unless explicitly designated as such using the words "prior art".

Reference throughout this document to "one embodiment", "certain embodiments", "an embodiment", "an example", "an implementation" or similar terms means that a particular feature, structure, or characteristic described in connection with the embodiment, example, or implementation may be included in at least one embodiment, example, or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples, or implementations without limitation.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or similar terms, as used herein, is defined as a sequence of instructions designed for execution on a computer system. A "program", or "computer program", may include a subroutine, a function, a procedure, an object method, a script, a program module, an object implementation, a script, a program module, an executable application, an applet, a servlet, a source code, an object code, a shared library/dynamic load library and/or other sequence of instructions designed for execution on a computer system. The term "processor", "controller", "CPU", "computer" and the like as used herein encompasses both hard programmed, special purpose, general purpose and programmable devices and may encompass a plurality of such devices or a single device in either a distributed or centralized configuration without limitation.

The use of terminology herein for first, second, and third to describe an element is to be merely interpreted as a label, and does not imply timing or other specific attributes. The designation of a series, such as (1), (2), (3), or (i), (ii), (iii), describes distinct items or operations for purposes of readability and does not imply timing or other specific attributes. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The term "electronic device" is used herein to describe a physical device that utilizes the properties of electrons for accomplishing in whole or in part its purpose. An electronic device may additionally utilize light, such as in optoelectronic (optical transceiver modules) and electro-optic (e.g. image sensors) devices; sound, such as in surface-acoustic wave (SAW)-based clock oscillator devices; or mechanical motion, such as in micro-electro-mechanical (MEMS)-based clock oscillator devices or other physical phenomenon. Electronic devices well suited for this application include without limitation integrated circuits (ICs), semiconductor chips, packaged semiconductor chips, electronic components and modules, transceivers, transponders, serializers and deserializers (e.g. SERDES), clock timing sources, signal (e.g. pulse, pattern, data) sources, electronic systems and components of such systems, printed circuit boards (PCBs), and PCB assemblies.

The term "signal" herein describes a real-world signal, such as an electromagnetic signal, an optical signal, or an acoustic signal. The scope of this application relates to data signals and clock timing signals. A data signal may be a real-world signal that may carry information primarily in its levels. A clock timing signal may be a real-word signal that may carry information primarily in its edges (clock transitions). Clock timing signals are generally discussed throughout this application for illustrative purposes, but should not be interpreted as limiting unless specified within a claim.

A real-world signal can be converted into a mathematical or data representation of the original signal. In some instances, this representation is also referred to as the signal that it represents. In a mathematical abstraction, the domain of a continuous-time signal is the set of real numbers (or some interval thereof).

The term "noise", or interference, is used herein to describe an undesirable signal or a set of undesirable signals that may alter, disturb, interfere, or combine with an original (or desired) signal.

The term "waveform" is used herein to represent the shape of a signal moving in a physical medium or an abstract representation.

The spectrum, or frequency spectrum, of a time-domain signal generally refers to a representation of that signal in the frequency domain. The spectrum may be derived from the time-domain signal using, for example, a Fourier transform, such as a discrete Fourier transform (DFT) or a fast-Fourier transform (FFT). The spectrum may be presented as a graph of an amount versus frequency, where the amount may be quantified, for example, as amplitudes, phases, magnitudes, or powers. The amount may be an instantaneous or average amount.

The spectrum may include spurious signals or spurious noise, sometimes referred to as simply "spurs", that may be visible as distinct spikes in a graph of magnitude versus frequency (i.e., the frequency spectrum). Such spurs may offer insight into the mechanisms that created the signal. For example, these spurs may relate to signal harmonics, electronic crosstalk, electromagnetic pollution, mechanical vibrations (e.g. microphonics), and/or power-supply surges. The spurs may be inherent to the signal and/or added to the signal from one or more noise sources during the measurement. Understanding the source of these spurs may help to eliminate them.

The term "application system" is used herein to describe an electronic system that processes information between an input and an output. The application system typically transforms one signal into another to provide a desired system response. Furthermore, the application system may consist of a series of interconnected blocks, each block processing a signal as it passes between its own set of inputs and outputs. Example application systems include communication systems, control systems, radar systems, servers, phase-locked loops, and high-speed serial-data digital communication links.

Clock Timing Signals

In general, a two-state clock timing signal oscillates between a high-level state and a low-level state, and the time between recurring edges of the clock timing signal is often periodic or pseudo-periodic. The clock timing signal has edges with a rising slope direction, and edges with a falling slope direction, and these edges may be used to control the timing of actions. For many applications, the clock timing signal is ideally a periodic wave such as a sine wave, a square wave, or a stream of pulses. In practice, the clock timing signal may contain characteristics that make the waveform imperfect and therefore is referred to herein as "pseudo-periodic", with such imperfections including variations in time of amplitude, pulse width, period, frequency, rise time, or fall time, for example. Furthermore, some imperfections are sometimes intentionally introduced onto the clock timing signal. For example, spread-spectrum technology introduces a controlled amount of frequency modulation onto the clock timing signal to minimize electromagnetic interference (EMI) emissions. The clock timing signal can serve to define a time reference for the movement of data within a digital system.

A clock timing signal is generally derived from a clock timing source. The following are non-limiting examples of clock timing sources that may output at least one clock timing signal: crystal oscillator (XO), voltage-controlled oscillator (VCO), voltage-controlled crystal oscillator (VCXO), voltage-controlled surface-acoustic wave (SAW) oscillator (VCSO), oven-controlled crystal oscillator (OCXO), temperature-controlled crystal oscillator (TCXO), programmable clock oscillator, phase locked loop (PLL)-based clock synthesizer, fractional-N clock synthesizer, SAW oscillator, micro-electro-mechanical systems (MEMS) oscillator, temperature-compensated MEMS oscillator (TCMO), clock-recovery unit (CRU), clock-generation integrated circuit (IC), distribution-buffer IC, jitter-attenuation IC, frequency-translation IC, clock-multiplier IC, spread-spectrum clock IC, clock IC, clock module, clock circuit, and a semiconductor chip that outputs the clock timing signal.

A clock timing signal may also be derived from an electronic device that outputs a data signal, for example, if the logical data pattern output by the device is defined to be a clock-like data pattern such as "10" repeating, or "1100" repeating, where 1 and 0 represent logic high and low, respectively. Additionally, a data signal can pass through an electronic device known as a clock-data recovery (CDR) block to extract a clock timing signal from the data signal.

Measurement Technologies

Some measurement technologies can provide frequency-domain information related to noise in a signal. For example, a spectrum analyzer and a phase-noise analyzer are two measurement technologies that can be used for analyzing noise by spectral analysis. The phase-noise analyzer can present measured phase-noise data in the form of a phase-noise spectrum, also referred to as a phase noise plot, for subsequent analysis. Phase deviations in the clock timing signal, or phase noise, can include random and/or spurious phase fluctuations that disrupt a periodic signal's linear phase trend. Phase noise can be characterized as a power spectral density of phase fluctuations, and can have assigned units of decibels relative to a carrier in a 1-Hz bandwidth, denoted by dBc/Hz, and may be associated with a particular frequency offset from the carrier frequency. Phase noise data comprises one or more phase noise data points. An example phase noise data point may be −102 dBc/Hz at an offset frequency of 10 kHz. Example phase-noise analyzers include models E5505A and E5052B manufactured by Keysight Technologies (Santa Rosa, Calif.).

Phase noise measurements may be categorized as one-port or two-port measurements. A one-port phase noise measurement may characterize phase noise in a clock timing signal output by an electronic device having at least one output port. A two-port phase noise measurement may characterize phase noise added by an electronic device having an input and an output port (e.g. also referred to as a two-port electronic device) to a clock timing signal as the clock timing signal passes between input and output ports of the device.

A spectrum analyzer may be based on superheterodyne technology, and may also be referred to as a swept-frequency analyzer or a superheterodyne analyzer. Superheterodyne technology can refer to reducing an incoming signal in frequency by mixing. The spectrum analyzer based on superheterodyne technology can measure spectral-power, but may present data in terms of power spectral density, and therefore phase-noise data, of the clock timing signal. An example spectrum analyzer is model N9000B CXA manufactured by Keysight Technologies (Santa Rosa, Calif.).

In general, jitter may be described as the variation of a timing event. Some types of jitter include: time-interval error (TIE) jitter, period jitter, cycle-to-cycle jitter, half-period jitter, and N-cycle jitter. TIE jitter is typically defined as the short-term variation (i.e. above 10 Hz in frequency) of a significant instant (i.e. edge) of a digital signal from its ideal position in time. As such, TIE jitter measures the variation of edges in a signal from their ideal positions in time. Period jitter is typically defined as the variation of a period in a signal from its mean period. For clock timing signals, a period jitter value may be computed as the difference between two neighboring TIE jitter values. Cycle-to-cycle jitter is typically defined as the variation in period between two adjacent cycles in a signal. Half-period jitter is typically defined as the variation of any half-period in a signal from its mean half-period. N-cycle jitter is typically defined as the variation between two edges in a signal that are N-cycles apart. Other types of jitter may also exist.

Additionally, a set of values for each type of jitter may be decomposed into one or more statistical components of jitter. Example statistical components of jitter include:
- a random component of jitter, also referred to as random jitter (RI);
- a deterministic component of jitter, also referred to as deterministic jitter (DJ);
- a periodic component of jitter, also referred to as periodic jitter (11);
- a data-dependent component of jitter, also referred to as data-dependent jitter (DDJ) or inter-symbol interference (ISI) jitter;

The RJ may be created by random noise and characterized by a Gaussian distribution. The DJ may be created by system mechanisms (such as crosstalk, reflections, loss) and/or bandwidth limitations (such as ISI) and characterized by a distribution that is bounded in time. The DJ may include PJ, and DDJ. The PJ may be described as jitter that repeats in a cyclical fashion, and when associated with a serial-data signal, may be uncorrelated to the serial-data bit pattern. The DDJ may describe the time differences required for a signal to arrive at a receiver threshold when starting from different places in bit sequences. Other statistical components of jitter may also exist.

Furthermore, the type of jitter and statistical component of jitter may be combined to identify a specific meaning. For example, random TIE jitter refers to the random statistical component of TIE jitter; deterministic TIE jitter refers to the deterministic statistical component of TIE jitter; periodic period jitter refers to the periodic statistical component of period jitter. Other combinations are also possible.

Two-Port Electronic Device 110

Certain example mechanisms by which the embodiments herein benefit providing an analysis of phase noise in a signal are described below with reference to FIGS. 1 through 8.

Figure 1:
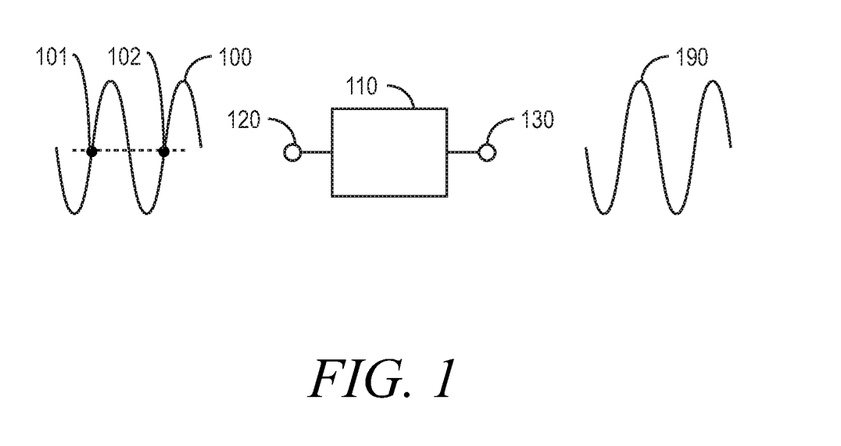
FIG. 1 is a representative illustration of a signal before and after passing through an electronic device.

FIG. 1 illustrates a scenario benefiting from one or more illustrative embodiments consistent with the present invention. Here, a clock timing signal 100 is shown to pass through an example two-port electronic device 110, entering the device at an input port 120 and exiting at an output port 130. The input 100 and output 190 clock timing signals are depicted in FIG. 1 as sine waves for simplicity, but may have a different shape in practice. Some electronic devices filter phase noise in a signal as the signal passes though them. Some of these devices further sample the phase of the signal at their input, and use this phase information to steer a control loop that influences the phase of the output signal. An example of such a device is a phase-locked loop (PLL), which typically includes a phase detector at its input. Common implementations of phase detectors are edge triggered, meaning the crossing points of an input signal (corresponding to the phase of the input signal) at some vertical threshold level, typically near the middle of the signal, are sampled. This sampling process is illustrated in FIG. 1 by two sample points (101, 102) appropriate for an example phase detector configured to trigger on rising-edges only of a clock timing signal 100. Other configurations are also possible. In such scenarios, it can be important to quantify the extent than an electronic device filters phase noise in an input signal as the signal passes through the device. This application discusses methods and apparatuses that analyze this phase noise filtering process. Other scenarios benefiting from embodiments in this application also exist.

Method for Analyzing Phase Noise

Figure 2:
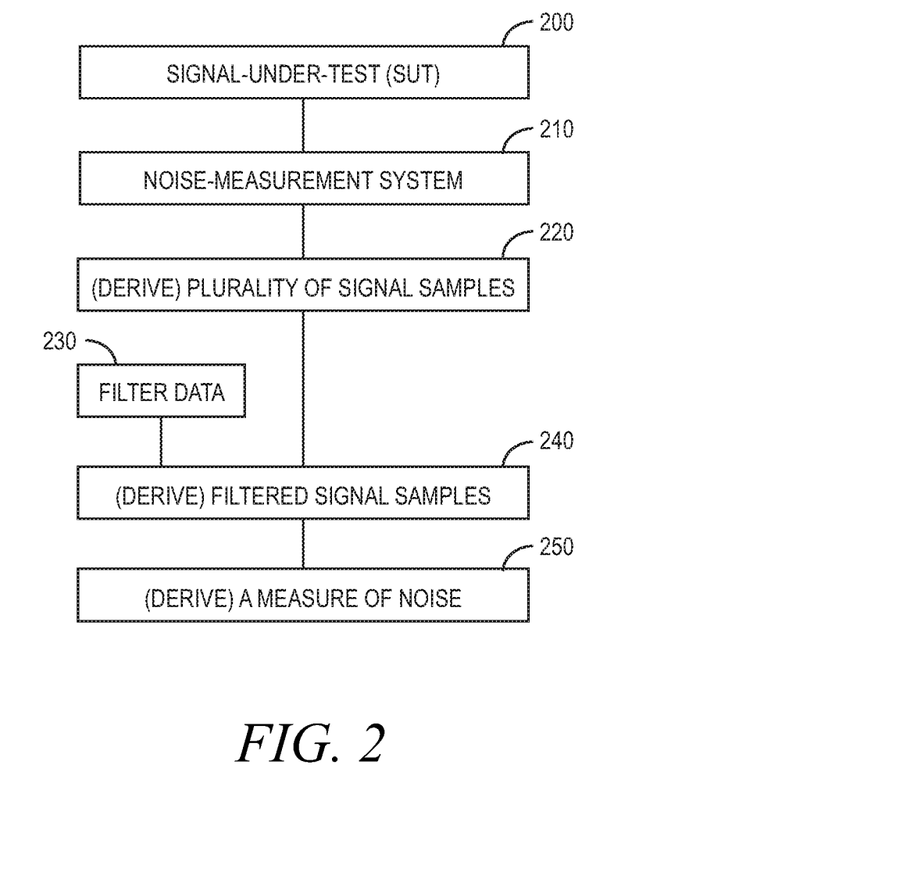
FIG. 2 is a representative flow chart of a method for analyzing noise in a signal under test (SUT) in accordance with certain embodiments consistent with the present invention.

FIG. 2 is a representative flow chart of a method for analyzing phase noise in a signal. The flow chart begins by measuring a signal with a noise-measurement system 210. The real-world signal from which a measurement is intended to characterize is referred to herein as a signal-under-test (SUT) 200. For example, the clock timing signal 100 illustrated in FIG. 1 may be a SUT when input to a noise-measurement system. The noise-measurement system 210 is used to derive a plurality of signal samples 220 from the SUT 200, each signal sample representing a value of phase noise in the SUT 200 at a corresponding offset frequency. The term "signal samples" refers generally to one or more signal samples in the plurality of signal samples 220. The term "offset frequency" is commonly used to denote a frequency offset from the carrier (i.e. fundamental) frequency of a signal.

Figure 3:
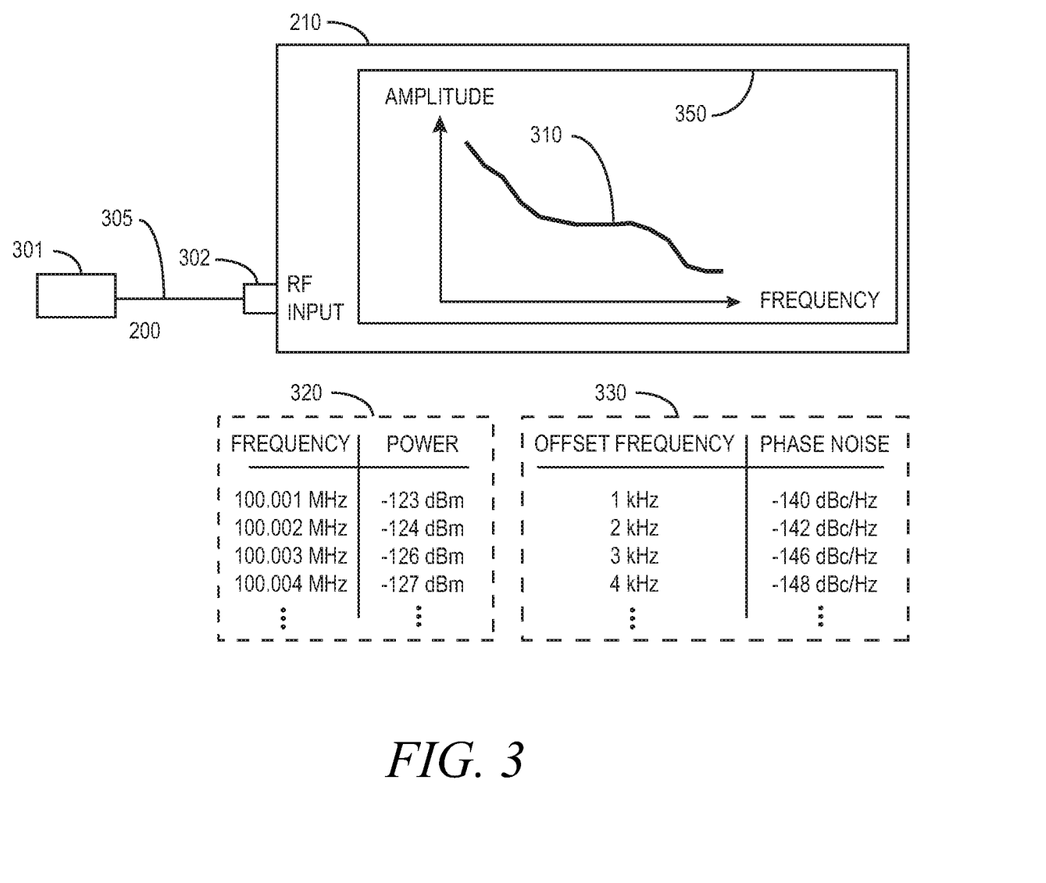
FIG. 3 depicts an example measurement performed on a SUT in accordance with certain embodiments consistent with the present invention.

FIG. 3 describes this derivation step 220 of the flow chart in more detail. Referring to FIG. 3, an example electronic device 301 outputs a SUT 200 to be measured by a noise-measurement system 210. The SUT 200 is denoted by reference numeral 200 near the output of the electronic device 301 in FIG. 3 merely as an illustrative aid to indicate a signal flowing between blocks. The SUT 200 may be transmitted using any suitable signaling type, such as transistor-transistor logic (TTL), low-voltage TTL (LVTTL), stub series terminated logic (SSTL), complementary metal-oxide-semiconductor (CMOS), low-voltage CMOS (LVCMOS), emitter-coupled logic (ECL), positive ECL (PECL), low-voltage PECL (LVPECL), low-voltage differential signaling (LVDS), current-mode logic (CML), and high-speed transceiver logic (HSTL) or others without limitation. The SUT 200, which is analog in nature, may be optical or electrical, single-ended or differential. The SUT 200 may be, for example, a clock timing signal (e.g. sine wave or square wave), or a digital data signal. The SUT 200 may be represented by a voltage that varies with time. The electronic device 301 provides the SUT 200 through an output that may exist in the form of a standard or custom electrical or optical connector (e.g. BNC, SMA, triax, RJ45, Infiiniband, CX4, fiber-optic LC or SC connector), or connect to a physical probe. The output may be from an electronic device such as an integrated circuit (IC); a semiconductor chip; a packaged semiconductor chip; a printed circuit board (PCB); a PCB assembly; an electrical device, component or module; an optical transceiver; an optical transponder; a clock timing source (as discussed above); a test instrument; a serializer or deserializer (e.g. SERDES); a signal (e.g. pulse, pattern, data) source; or an electronic system or sub-system.

The SUT 200 may be accessed by connecting an output of the electronic device 301 to an input 302 of the noise-measurement system 210 using a connector 305, such as a coaxial electrical cable or optical fiber cable. The connector 305 may also be a physical probe attached from the noise-measurement system 210 to a suitable electrical contact point on the electronic device 301. A balun may be used to convert a differential signal output by the electronic device 301 into a single-ended SUT for subsequent measurement.

The example noise-measurement system 210 shown in FIG. 3 includes a noise-measurement unit to extract signal data from the SUT 200. The noise-measurement system 210 may also include a screen 350 to display charts 310 and other measurement-related information. Example noise-measurement systems include spectrum analyzers and phase-noise analyzers (as discussed above). Other noise-measurement systems may also exist.

The signal data can include phase noise data, but often includes intermediate data related more directly to the physical measurement, which can be post-processed to compute phase noise data. For example, the signal data output by a spectrum analyzer is normally spectral power data 320. The equipment operator can apply math to convert spectral power data 320 to phase noise data 330, assuming phase noise is the dominant noise mechanism in the SUT. To automate this process, some spectrum analyzer manufacturers sell licenses to unlock software shipped with their instruments to convert signal data into phase noise data. Phase-noise analyzers typically use phase noise data 330 for signal data, and usually include additional options to post-process this signal data into alternate forms of phase noise data. For example, the measured phase noise data can be post processed to produce averaged or smoothed plots of phase noise. Or, spurious noise present in the phase noise data can be identified and omitted before plotting or saving to a file. Or, the spurious noise can be converted to units of dBc and plotted simultaneously with random phase noise data in units of dBc/Hz.

Other post-processing options also exist, creating a variety of options for deriving a plurality of signal samples 220 from the noise-measurement system 210, where each signal sample represents a value of phase noise in the SUT 200 at a corresponding offset frequency. Typically each signal sample represents phase noise in units of dBc/Hz, although spurious noise present in the phase noise may alternatively be expressed in dBc. Embodiments in this application refer generally to phase noise including any combination of spurious and random phase noise.

Figure 4:
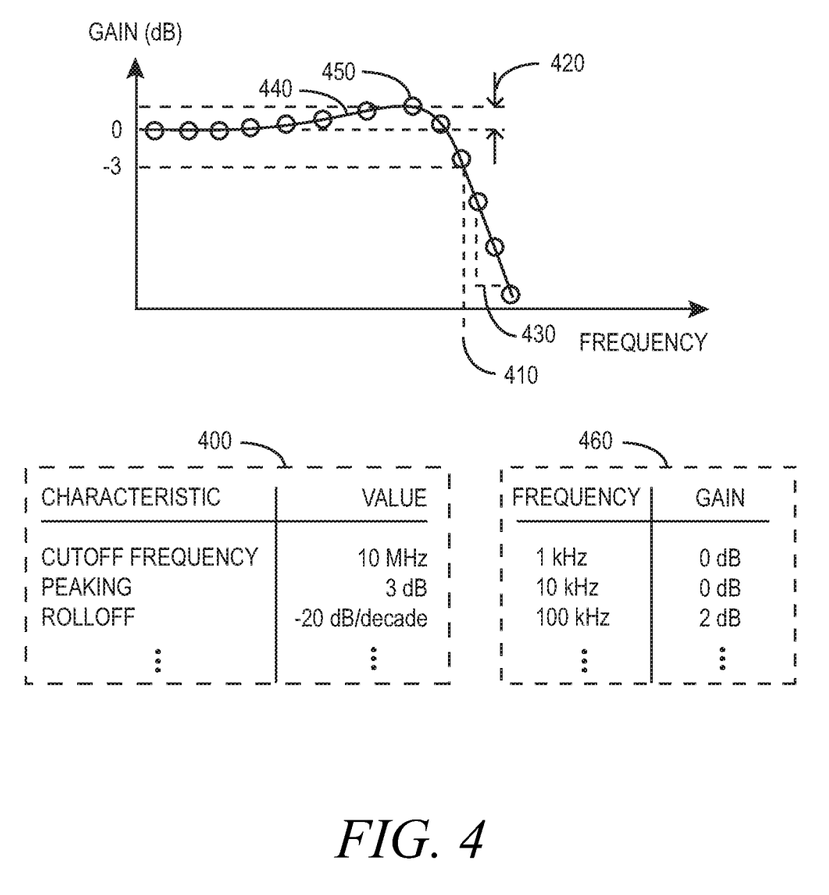
FIG. 4 depicts an example filter in accordance with certain embodiments consistent with the present invention.

Continuing the flow chart in FIG. 2, filter data 230 is received and used to derive filtered signal samples 240 from the plurality of signal samples 220. In general, filters operate to remove unwanted frequency components from a signal, to enhance wanted components, or both. Filters can be implemented in hardware or software using digital signal processing techniques. The frequency domain behavior of a filter can be analyzed according to its magnitude and phase response to an input signal, often summarized using Bode plots. FIG. 4 plots the gain of an example low-pass filter versus input frequency to illustrate various filter characteristics 400, such as cutoff frequency 410, peaking 420, and roll-off 430. The filter characteristics 400 describe in whole or in part the frequency response of a filter defined by the filter data 230. The filter characteristics 400 represent an application system's response to the signal as the signal passes through the application system. An example application system may be a two-port electronic device 110, such as a PLL. Properly accounting for phase noise as it propagates through a signal chain (such as a cascade of PLLs) can help identify and reduce sources of phase noise in the application system.

The filter data 230 may include data representing one or more of these filter characteristics 400. The filter data 230 may include one or more parameters used to model a filter mathematically as a piece-wise continuous 440 or discrete 450 function, such as cutoff frequency, damping factor, natural frequency, and time delay. Such a model may be implemented in the s- or z-mathematical domain. The following equation is an example s-domain filter, where $\zeta$ is a damping factor, $\omega_n$ is a natural frequency, and s is $2\pi f$, where f is a frequency to be filtered.

$$H(s) = \frac{2s\zeta\omega_n + \omega_n^2}{s^2 + 2s\zeta\omega_n + \omega_n^2}$$

For example, the filter data 230 can specify the form of this equation, and values for $\zeta$ and $\omega_n$ over some range of f. The filter data 230 may comprise one or more data points representing the response of a filter, such as gain, magnitude, and phase. The filter data 230 may include any combination of the above mentioned filter information and/or other information. Overall this information should be sufficient to filter the plurality of signal samples 220 in accordance with the filter data 230.

A two-port electronic device 110 that samples a signal 100, as discussed in relation to FIG. 1, must satisfy the Nyquist criterion to accurately represent the original signal. This requires a sampling frequency at least twice the highest frequency contained in the signal. So if a signal is sampled at frequency Fs, then the highest frequency that can be measured is Fs/2. Any frequency in the original signal located above Fs/2 will alias below Fs/2 after the original signal is sampled. This Fs/2 frequency is often called the Nyquist frequency. Furthermore, the frequency spectrum may be subdivided into intervals of Fs/2 called Nyquist zones, where the first, second, and third Nyquist zones extend from 0 to Fs/2, Fs/2 to Fs, and Fs to 3×Fs/2, respectively (and so on). Odd Nyquist zones contain exact replicas of the signal's spectrum (e.g. from the first Nyquist zone), and even Nyquist zones contain mirror images of the signal's spectrum. Spectrums in neighboring Nyquist zones may therefore be observed as mirror images of each other, and appear to visually "fold" across zone boundaries (located at integer multiple of Fs/2). The Nth Nyquist zone may alternatively be called Nyquist zone N herein, where N is an integer.

Figure 5:
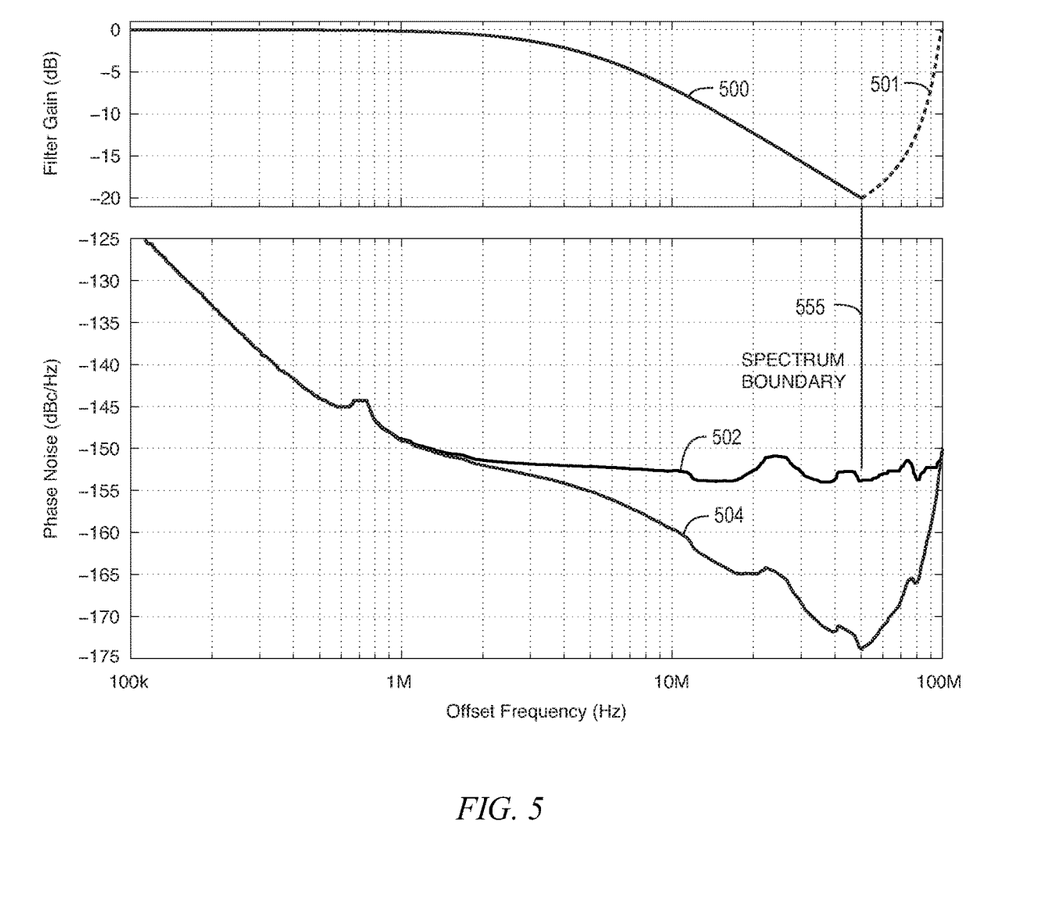
FIG. 5 illustrates a first example filtering process in accordance with certain embodiments consistent with the present invention.
Figure 6:
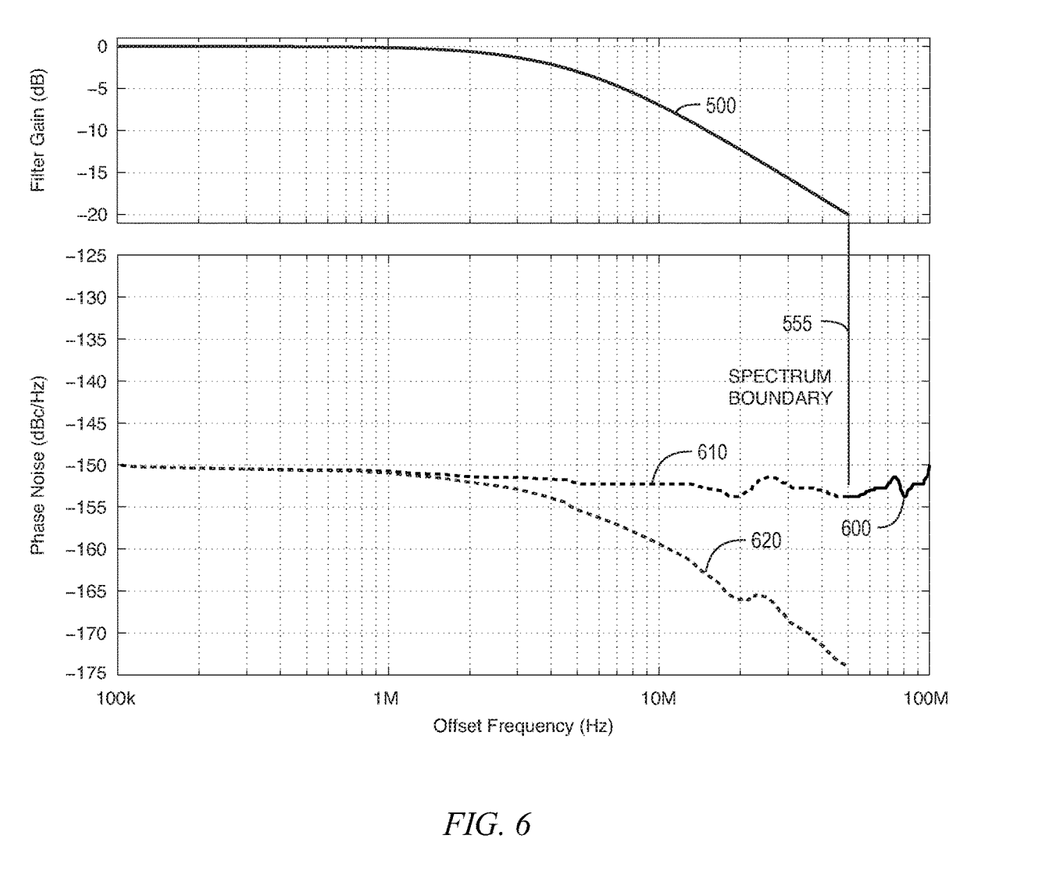
FIG. 6 illustrates a second example filtering process in accordance with certain embodiments consistent with the present invention.

The term "spectrum boundary" is used herein (in the context of a sampled signal) to represent a frequency located at an integer multiple of Fs/2, where Fs is the sampling frequency. A spectrum boundary may be considered to have two sides, with a first and second side located above and below the spectrum boundary, respectively; or alternatively, with the first and second side located below and above the spectrum boundary, respectively. Most application systems are designed to operate in the first Nyquist zone. FIGS. 5 and 6 and related discussion therefore focus on the first and second Nyquist zones, and the spectrum boundary between them, to describe certain illustrative embodiments consistent with the present invention. However, the same discussion applies generally to other Nyquist zones and should not be considered limiting unless specified within a claim.

Referring again to the flow chart in FIG. 2, the plurality of signal samples 220 is filtered in accordance with the filter data 230 to derive filtered signal samples 240. FIG. 5 illustrates one method to implement this filtering. The top chart in FIG. 5 shows an example PLL jitter filter gain curve 500 (also called a jitter transfer function) for filter data 230 defined, for example, by the above s-domain equation and values of 0 and 31.4 radians/second for $\zeta$ and $\omega_n$, respectively. This equation allows the filter gain to be computed as discrete points. For illustration purposes, these points are connected by a solid line in the top chart of FIG. 5 to plot a filter gain curve 500 between 100 kHz and 50 MHz. Some filter characteristics 400 associated with this filter data 230 include a 5 MHz (high pass) cutoff frequency, 0 dB peaking, and −20 dB/decade rolloff at high frequency. Although not plotted in FIG. 5, the filter gain continues to drop (at −20 dB/decade) beyond 50 MHz.

Suppose the above PLL's phase detector triggers on rising-edges only of a 100 MHz clock timing signal 100. Then the phase detector samples the input signal's phase at 100 MHz (i.e. Fs) and the boundary between the first and second Nyquist zones (i.e. spectrum boundary 555) is 50 MHz (i.e. Fs/2). Thus, the spectrum in the second Nyquist zone appears as the first Nyquist zone's spectrum (e.g. PLL filter gain curve 500) folded across the spectrum boundary 555. This folded filter gain curve 501 is drawn in the top chart of FIG. 5 using a dashed line. If curve 501 were instead plotted using a linear frequency axis, the first two Nyquist zone's spectra (e.g. 500, 501 curves) would visually appear as mirror images across the spectrum boundary 555. In a similar way, the filter characteristics 400 (such as cutoff frequency, peaking, and rolloff) represented by the filter gain curve 500 in the first Nyquist zone may also be visualized to fold across the spectrum boundary 555 into the second Nyquist zone.

An example plurality of signal samples 220 is plotted in the bottom chart of FIG. 5 as curve 502 at offset frequencies from roughly 100 kHz to 100 MHz. Although the plurality of signal samples 220 is discrete (as exemplified by table 460), the plurality of signal samples 220 is plotted in FIG. 5 as a solid line 502 merely for illustration. The plotted curve 502 is an example of phase noise in the 100 MHz clock timing signal driving the example PLL above (with associated filter gain curve 500). The bottom chart in FIG. 5 also shows the filtered signal samples 240 as a separate curve 504. The filtered signal samples 240 may be computed by adding filter gain curves 500, 501 (in dB) to curve 502 for the plurality of signal samples 220 (in dBc/Hz). The filtered signal samples curve 504 overlaps the plurality of signal samples 220 curve 502 for offset frequencies where the filter gain is 0 dB (i.e. unity gain) in curves 500, 501.

The example filter data 230 from FIG. 5 is shown again in the top chart of FIG. 6 for reference as curve 500. FIG. 6 illustrates an alternative method to derive filtered signal samples for the set of signal samples located on the right side of the spectrum boundary 555 in FIG. 5. To filter the signal samples located on the right side of the spectrum boundary 555 (shown as curve 600 in FIG. 6), the set of signal samples located on the right side of the spectrum boundary 555 are first folded across the spectrum boundary 555 to become curve 610 in FIG. 6 before filtering in accordance with the filter data 230. The filtered signal samples 240 corresponding to the set of signal samples located to the right of the spectrum boundary 555 are represented by curve 620 in FIG. 6.

To summarize, the filtered signal samples 240 for the method discussed in relation to FIG. 5 may be illustrated by curve 504. The filtered signal samples 240 for the method discussed in relation to FIG. 6 may be illustrated by curve 620 and the portion of curve 504 located on the left side of the spectrum boundary 555. In this way, the filtered signal samples 240 represent signal samples 220 filtered in accordance to filter data 230 over a range of offset frequencies approximately from 100 kHz to 100 MHz.

FIGS. 5 and 6 illustrate one or more methods for receiving filter data 230 representing filter characteristics 400 on a first side of a spectrum boundary 555, and deriving filtered signal samples 240 from filtering signal samples representing phase noise located on the first side of the spectrum boundary 555 in accordance with the filter data 230, and a mathematical analysis resulting in one of: folding the filter characteristics 400 across the spectrum boundary 555 to filter signal samples representing phase noise located on a second side of the spectrum boundary 555; and folding signal samples representing phase noise located on the second side of the spectrum boundary 555 across the spectrum boundary 555 before filtering in accordance with the filter data 230.

Although the analysis so far has focused mainly on Nyquist zones 1 and 2, certain illustrative embodiments presented herein may apply generally to other Nyquist zones. The PLL example discussed above in relation to FIGS. 5 and 6 is further developed in FIG. 7 to illustrate filtering signal samples extending into Nyquist zone 8. Here, the PLL filter characteristics 400 illustrated by the portion of the filter gain curve 701 located on the left side of spectrum boundary 555 (in the top chart of FIG. 7) are folded across multiple spectrum boundaries (e.g. 555, 710-715) to extend the filter gain curve to higher frequencies. The signal samples shown as curve 702 (in the bottom chart of FIG. 7) extend in FIG. 7 up to roughly 400 MHz. This 400 MHz offset frequency may be an appropriate upper limit to analyze phase noise data if the example PLL used here has an input bandwidth of 500 MHz (note that a 400 MHz offset frequency corresponds to 500 MHz in the clock timing signal driving the PLL, since the clock timing signal's fundamental frequency in this example is 100 MHz). Applying the methodology discussed above to filter the signal samples 220 shown by curve 702 results in deriving the filtered signal samples 240 shown by curve 703 in FIG. 7 (which overlaps curve 702 where curve 701 is 0 dB).

Figure 7:
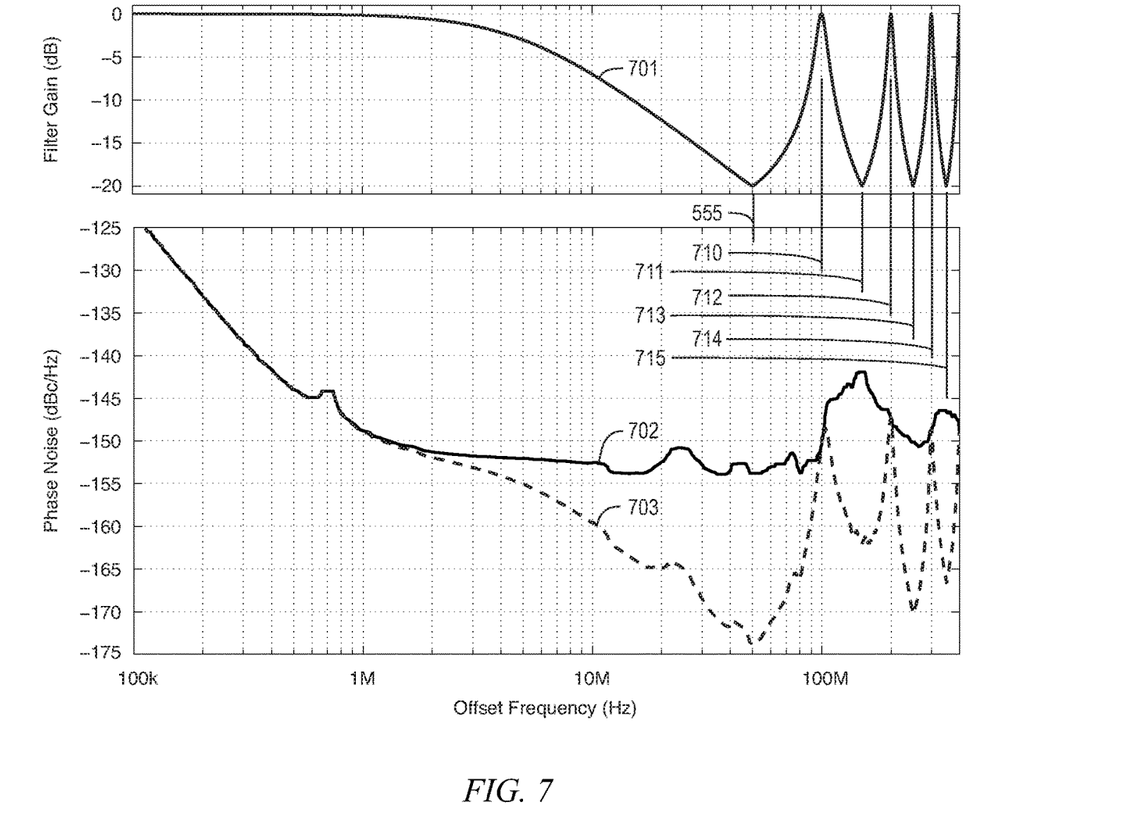
FIG. 7 illustrates a third example filtering process in accordance with certain embodiments consistent with the present invention.

Alternatively, the method illustrated in FIG. 6 may be applied to filter signal samples 702 above 50 MHz in FIG. 7. Here, signal samples 702 from each Nyquist zone above zone 1, including Nyquist zone 2 (from 555 to 710), 3 (from 710 and 711), 4 (from 711 to 712), 5 (from 712 to 713), 6 (from 713 to 714), 7 (from 714 to 715), and 8 (from 715 to the last point in 702), may be separately folded back through one or more spectrum boundaries (555, 710 to 715) into Nyquist zone 1, and filtered as illustrated in FIG. 6.

The filtering process discussed above, which adds values in dB, assumes the frequency values associated with the signal samples 220 (e.g. curve 702) and filter data (e.g. curve 701) match. When this is not true, interpolation can be performed on either the signal samples or the filter data to derive new data with matching frequency. Therefore, certain illustrative embodiments derive at least one phase noise value in the filtered signal samples 240 from an interpolation on the signal samples 220.

The example data used to illustrate the plurality of signal samples 220 shown in FIGS. 5 through 7, including plotted curves 502, 600, and 702, was derived from a spectrum analyzer assuming that all the noise present is phase noise. While spectrum analyzers can measure frequencies well above the carrier (e.g. fundamental) frequency in a SUT, phase-noise analyzers are usually limited in offset frequency to roughly 30% of the carrier frequency. For example, many phase-noise analyzers can only measure phase noise in a 100 MHz clock timing signal to about a 30 MHz offset frequency. If this clock timing signal is driving a PLL whose input bandwidth is 500 MHz, as discussed in relation to FIG. 7, and phase noise in the clock timing signal is measured using a phase-noise analyzer, then signal data would only exist up to about 30 MHz in plotted curve 702 in FIG. 7.

One strategy to obtain phase noise data at higher offset frequencies is to derive them from the signal data during post processing. For example, the last measured phase noise value (e.g. at 30 MHz) could simply be used to estimate all signal samples located at higher offset frequencies (e.g. above 30 MHz). Or, an average phase noise value near the end of the phase noise curve could be computed and used to estimate phase noise at higher offset frequencies. Therefore, one or more illustrative embodiments derive at least one signal sample representing phase noise on the second side of the spectrum boundary 555 from at least one signal sample located on the first side of the spectrum boundary 555 or at the spectrum boundary 555. Furthermore, one or more illustrative embodiments use the same value for all signal samples representing phase noise on the second side of the spectrum boundary 555.

Completing the flow chart in FIG. 2, a measure of noise 250 is derived from the filtered signal samples 240. This measure of noise 250 may be considered timing noise. One common measure of noise 250 is RMS noise (in radians), $N_{RMS}$, computed by integrating phase noise over offset frequency according to the following equation, $$N_{RMS} = \sqrt{2 \int 10^{\frac{L(f)}{10}} df}$$

where L(f) represents phase noise values in dBc/Hz as a function of offset frequency. In general, L(f) may be either the plurality of signal samples 220 or the filtered signal samples 240. The measure of noise 250 in FIG. 2 may compute $N_{RMS}$ using the filtered signal samples 240 for L(f). Another popular measure of noise 250 is TIE jitter, whose RMS value in units of seconds may be computed as $J_{RMS}=N_{RMS}/(2\pi F_C)$, where $F_C$ is the carrier (i.e. fundamental) clock) frequency of the SUT 200 (in Hertz). TIE jitter may alternatively be called "phase jitter", such as in the PCI Express Base Specification produced by the PCI-SIG consortium in Beaverton Oreg., for example. Other measures of noise 250 may be derived from the filtered signal samples 240, including measures of residual frequency modulation (FM), error-vector magnitude (EVM), Allan deviation, period jitter, signal-to-noise ratio (SNR), and more. Therefore, one or more embodiments derive at least one measure of noise 250 from the filtered signal samples 240.

Figure 8:
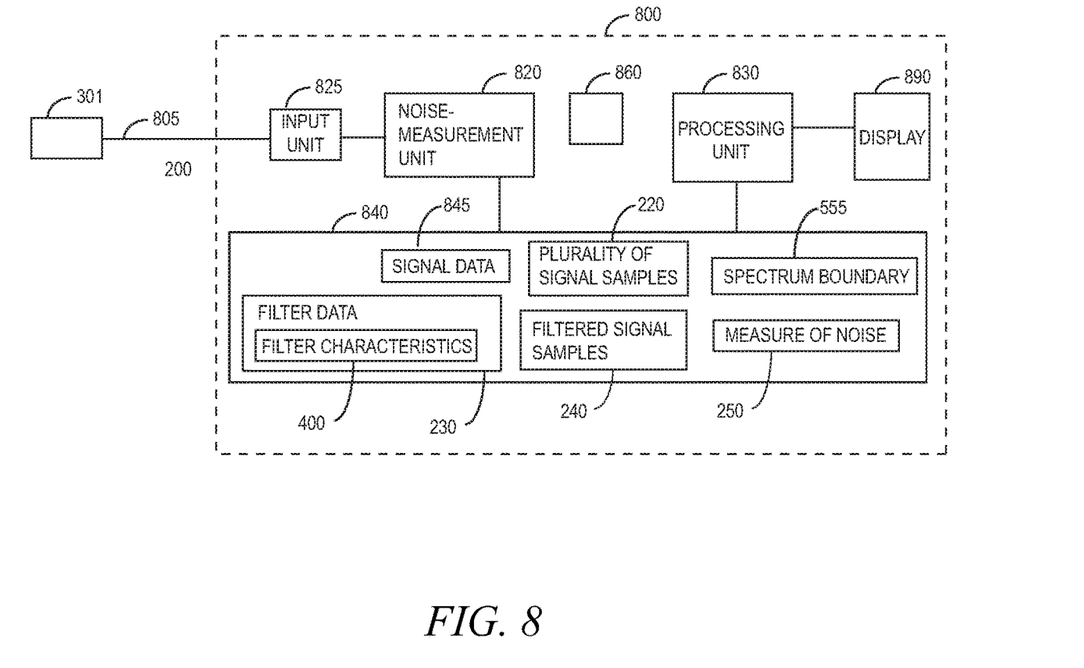
FIG. 8 is a block diagram of an example apparatus in accordance with certain embodiments consistent with the present invention.

Certain other illustrative embodiments, as depicted in FIG. 8, relate to an apparatus 800 that may be used to characterize a SUT 200 similar to as discussed above in relation to FIGS. 1 to 7. The apparatus 800 has an input unit 825 to receive a SUT 200 from an electronic device 301, such as a clock timing source. The input unit 825 attaches to the electronic device 301 using a connector 805. The at least one input and the connector 805 may be a standard or custom electrical or optical connector, or a physical probe. The apparatus 800 includes a noise-measurement unit 820 that receives a signal from the input unit 825. The noise-measurement unit 820 converts the signal from the input unit 825 into signal data 845 (as discussed above). The apparatus includes at least one processing unit 830 (i.e., one or more programmed processors or computers or controller or hard-wired processing devices).

In one or more illustrative embodiments, the at least one processing unit 830 may perform a similar procedure discussed above in relation to FIGS. 1 to 7. The at least one processing unit 830 receives the signal data 845 and filter data 230, where the filter data 230 represents filter characteristics 400 on a first side of a spectrum boundary 555. The at least one processing unit 830 operates to compute a plurality of signal samples 220 derived from the signal data 845, where each signal sample represents a value of phase noise in the SUT 200 at a corresponding offset frequency. The at least one processing unit 830 also derives filtered signal samples 240 from filtering signal samples 220 representing phase noise located on the first side of the spectrum boundary 555 in accordance with the filter data 230, and a calculation resulting in one of: folding the filter characteristics 400 across the spectrum boundary 555 to filter signal samples representing phase noise located on a second side of the spectrum boundary 555; and folding signal samples representing phase noise located on the second side of the spectrum boundary 555 across the spectrum boundary 555 before filtering in accordance with the filter data 230. The at least one processing unit 830 also derives a measure of noise 250 (as discussed above) from the filtered signal samples 240.

The apparatus 800 includes at least one memory 840 connected to the at least one processing unit 830 with sufficient storage for the at least one processing unit 830 to perform its operations (as described above). The at least one memory 840 may also connect to the noise-measurement unit 820 and/or other blocks. Operating memory 860 may also be available to the at least one processing unit 830 and/or other blocks. Any of the memories mentioned above may include any type of memory used to store digital data, including but not limited to random access memory (RAM), magnetic, optical, hard drive, SRAM, DRAM, EPROM, EEPROM, flash or other volatile or non-volatile memory.

The apparatus 800 may also include a display 890 to provide information, such as the measure of noise 250, to a user.

Those of ordinary skill in the art will recognize upon consideration of the present teachings that one or more of the example embodiments can be accomplished using any form of storage or computer-readable medium, including but not limited to distribution media, intermediate storage media, execution memory of a computer, computer-readable storage device, and any other medium or device or non-transitory storage capable of storing for later reading by a computer program implementing one or more embodiments.

Those of ordinary skill in the art will appreciate that the methods described above can be implemented in any number of variations, including adding or deleting certain actions, without departing from the scope of one or more of the embodiments.

Those of ordinary skill in the art will recognize upon consideration of the present teachings that the methods and associated data used to implement one or more embodiments can be implemented using disc storage or other forms of storage, including but not limited to Read Only Memory (ROM) devices, Random Access Memory (RAM) devices, optical storage elements, magnetic storage elements, magneto-optical storage elements, flash memory, core memory and/or other equivalent storage technologies.

Special-purpose hardware dedicated to performing the functions described herein may also be implemented. Further implementations may include software residing on a general-purpose computer, or a standalone computer that receives files or other data, and provides off-line analysis.

Those of ordinary skill in the art will recognize that one or more embodiments may be implemented using hardware components such as special-purpose hardware and/or dedicated processors, which are within the scope and spirit of the above description and in the appended claims. Similarly, custom circuits, microprocessors, general purpose computers, microprocessor based computers, microcontrollers, ASICs, and/or other dedicated hard wired logic may be used to construct alternative equivalent embodiments. Hence, the term "one or more programmed processors" should be interpreted to mean a device that is programmed or designed as a dedicated hardware device to carry out a programmed function.

Since certain changes may be made in the foregoing disclosure without departing from the scope of the embodiments herein involved, it is intended that all matter contained in the above description and depicted in the accompanying drawings be construed in an illustrative and not in a limiting sense.

Certain embodiments may be implemented using a programmed processor executing programming instructions that in certain instances are broadly described above in flow chart form that can be stored on any suitable electronic or computer readable storage medium (such as, for example, disc storage, Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies). However, those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain embodiments of the invention. Error trapping can be added and/or enhanced and variations can be made in user interface and information presentation without departing from certain embodiments of the present invention. Such variations are contemplated and considered equivalent.

While the above description contains many specificities, these should not be construed as limitations on the scope, but rather as an exemplification of one or more preferred embodiments thereof. Many other variations are possible. Accordingly, the scope should be determined not by the embodiments illustrated, but by the appended claims and their legal equivalents. While certain illustrative embodiments have been described, it is evident that many alternatives, modifications, permutations and variations will become apparent to those skilled in the art in light of the foregoing description.

Thus, in accord with certain illustrative embodiments, an apparatus 800 comprises: an input unit 825 to receive a signal-under-test (SUT) 200; a noise-measurement unit 820 to convert the SUT 200 into signal data 845;

a) a processing unit 830; memory 840 connected to the processing unit 830 with sufficient storage for the processing unit 830 to perform its operations; and programming instructions for the processing unit 830 that causes the processing unit to:

i) receive the signal data 845, ii) derive a plurality of signal samples 220 from the signal data 845, each signal sample representing a value of phase noise in the SUT 200 at a corresponding offset frequency, iii) use filter data 230 that represents filter characteristics 400 of an application system on a first side of a spectrum boundary 555 to filter a first set of signal samples representing phase noise located on the first side of the spectrum boundary in accordance with the filter data, and iv) filter a second set of signal samples representing phase noise located on a second side of the spectrum boundary by performing an analysis that results in one of:

(A) folding the filter characteristics 400 across the spectrum boundary 555 and using the folded filter characteristics to filter signal samples 220 representing phase noise located on a second side of the spectrum boundary 555, and (B) folding signal samples 220 representing phase noise located on the second side of the spectrum boundary 555 across the spectrum boundary 555 and filtering the folded signal samples in accordance with the filter data 230.

In certain implementations of the apparatus, the programming instructions further causes the processing unit to derive a measure of noise 250 from the first and second set of filtered signal samples.

In certain implementations of the apparatus, the measure of noise 250 represents time-interval error (TIE) jitter.

In certain implementations of the apparatus, the programming instructions further causes the processing unit to derive the measure of noise 250 from integrating the first and second set of filtered signal samples 240 across offset frequency.

In certain implementations of the apparatus, the programming instructions further causes the processing unit to derive one value in the filtered signal samples from an interpolation on one of: i) the signal data 845, ii) the plurality of signal samples 220, and iii) the filter data 230.

In certain implementations of the apparatus, the programming instructions further causes the processing unit to derive at least one signal sample representing phase noise on the second side of the spectrum boundary 555 from at least one signal sample located on one: of the first side of the spectrum boundary 555, and the spectrum boundary 555.

In certain implementations of the apparatus, all signal samples on the second side of the spectrum boundary 555 have the same value.

In accord with certain illustrative embodiments, a method is based on (a) using a noise-measurement system to derive a plurality of signal samples 220, each signal sample representing a value of phase noise in a signal-under-test (SUT) 200 at a corresponding offset frequency, and (b) deriving filtered signal samples 240 from the plurality of signal samples 220 and filter data 230, where the filter data represents filter characteristics 400 of an application system on a first side of a spectrum boundary 555, by (i) filtering a first set of signal samples representing phase noise located on the first side of the spectrum boundary 555 in accordance with the filter data 230, and (ii) filtering a second set of signal samples representing phase noise located on a second side of the spectrum boundary 555 by performing an analysis that results in one of: (A) folding the filter characteristics 400 across the spectrum boundary 555 and using the folded filter characteristics to filter signal samples representing phase noise located on a second side of the spectrum boundary 555, and (B) folding signal samples representing phase noise located on the second side of the spectrum boundary 555 across the spectrum boundary 555 and filtering the folded signal samples in accordance with the filter data 230.

In certain illustrative embodiments of the method, the method includes (c) deriving a measure of noise 250 from the filtered signal samples 240.

In certain illustrative embodiments of the method, the measure of noise 250 represents TIE jitter.

In one or more illustrative embodiments of the method, one value in the filtered signal samples is derived from an interpolation on one of: i) the plurality of signal samples 220, and ii) the filter data 230.

In one or more illustrative embodiments of the method, the measure of noise 250 is derived from integrating the filtered signal samples across offset frequency.

In one or more illustrative embodiments of the method, at least one signal sample representing phase noise on the second side of the spectrum boundary 555 is derived from at least one signal sample located on one: of the first side of the spectrum boundary 555, and the spectrum boundary 555.

In one or more illustrative embodiments of the method, all signal samples representing phase noise on the second side of the spectrum boundary 555 have the same value.

In certain illustrative embodiments, the SUT 200 is a clock timing signal.

In accord with certain embodiments, a device comprises (a) tangible, non-transitory, computer-readable storage device; and (b) programming instructions on the storage device that when carried out on one or more programmed processors carry out a process, where the programming instructions comprise: (i) instructions for receiving a plurality of signal samples 220, each signal sample representing a value of phase noise in a signal-under-test (SUT) 200 at a corresponding offset frequency; (ii) instructions for deriving filtered signal samples 240 from the plurality of signal samples 220 and filter data 230, where the filter data represents filter characteristics 400 of an application system on a first side of a spectrum boundary, by (A) filtering a first set of signal samples representing phase noise located on the first side of the spectrum boundary 555 in accordance with the filter data 230, and (B) filtering a second set of signal samples representing phase noise located on a second side of the spectrum boundary 555 by performing an analysis that results in one of: (1) folding the filter characteristics 400 across the spectrum boundary 555 and using the folded filter characteristics to filter signal samples representing phase noise located on a second side of the spectrum boundary 555, and (2) folding signal samples representing phase noise located on the second side of the spectrum boundary 555 across the spectrum boundary 555 and filtering the folded signal samples in accordance with the filter data 230.

In certain implementations of the device, the instructions further comprise instructions for (c) deriving a measure of noise 250 from the filtered signal samples 240.

In certain implementations of the device, the measure of noise 250 represents TIE jitter.

In certain implementations of the device, the instructions further comprise instructions for deriving one value in the filtered signal samples from an interpolation on one of: i) the plurality of signal samples 220, and ii) the filter data 230.

In certain implementations of the device, the measure of noise 250 is an RMS value.

In certain implementations of the device, the instructions further comprise instructions for deriving the measure of noise 250 comprise integrating the filtered signal samples 240 across offset frequency.

In certain implementations of the device, the instructions further comprise (d) instructions for deriving at least one signal sample representing phase noise on the second side of the spectrum boundary 555 from at least one signal sample located on one of: the first side of the spectrum boundary 555, and the spectrum boundary 555.

In certain implementations of the device, all signal samples representing phase noise on the second side of the spectrum boundary 555 have the same value.

In certain implementations of the device, the SUT 200 is a clock timing signal.

The many features and advantages of the invention are apparent from the above description. Numerous modifications and variations will readily occur to those skilled in the art. Since such modifications are possible, the invention is not to be limited to the exact construction and operation illustrated and described. Rather, the present invention should be limited only by the following claims.

What is claimed is:

1. An apparatus, comprising:
   a) an input unit to receive a signal-under-test (SUT);
   b) a noise-measurement unit to convert the SUT into signal data;
   c) a processing unit;
   d) memory connected to the processing unit with sufficient storage for the processing unit to perform its operations; and
   e) programming instructions for the processing unit that causes the processing unit to:
      i) receive the signal data,
      ii) derive a plurality of signal samples on a first side of a spectrum boundary from the signal data, each signal sample representing a value of phase noise at a corresponding offset frequency, wherein the deriving comprises representing phase noise located on a second side of the spectrum boundary that folds across the spectrum boundary onto the first side of the spectrum boundary, and
      iii) filter on the first side of the spectrum boundary the signal samples in accordance with filter data representing filter characteristics of an application system.

2. The apparatus of claim 1, wherein the SUT represents a clock timing signal having an SUT clock frequency, and the spectrum boundary is located at an offset frequency equal to half of the SUT clock frequency.

3. The apparatus of claim 2, wherein the phase noise that folds across the spectrum boundary all have a same value derived from at least one signal sample in the plurality of signal samples located on one of: the first side of the spectrum boundary, and the spectrum boundary.

4. The apparatus of claim 1, wherein the programming instructions further cause the processing unit to derive a measure of noise from the filtered signal samples.

5. The apparatus of claim 4, wherein the measure of noise represents time-interval error (TIE) jitter.

6. The apparatus of claim 5, wherein the SUT represents a clock timing signal, the spectrum boundary is located at an offset frequency equal to half of the SUT clock frequency, and the application system comprises at least one phase locked loop (PLL).

7. A method comprising:
a) using a noise-measurement system to derive a plurality of signal samples, each signal sample representing a value of phase noise in a signal-under-test (SUT) at a corresponding offset frequency;
b) creating derived signal samples on a first side of a spectrum boundary from the plurality of signal samples, wherein the creating comprises representing phase noise located on a second side of the spectrum boundary that folds across the spectrum boundary onto the first side of the spectrum boundary; and
c) filtering on the first side of the spectrum boundary the derived signal samples in accordance with filter data representing filter characteristics of an application system.

8. The method of claim 7, wherein the SUT represents a clock timing signal having an SUT clock frequency, and the spectrum boundary is located at an offset frequency equal to half the SUT clock frequency.

9. The method of claim 7, wherein the phase noise that folds across the spectrum boundary all have a same value derived from at least one signal sample in the plurality of signal samples located on one of: the first side of the spectrum boundary, and the spectrum boundary.

10. The method of claim 7, further comprising:
d) deriving a measure of noise from the filtered signal samples.

11. The method of claim 10, wherein the measure of noise represents time-interval error (TIE) jitter.

12. The method of claim 11, wherein the SUT represents a clock timing signal having an SUT clock frequency, and the spectrum boundary is located at an offset frequency equal to half of the SUT clock frequency.

13. The method of claim 12, wherein the application system comprises at least one phase locked loop (PLL).

14. The method of claim 13, wherein the noise measurement system comprises a phase noise analyzer.

15. The method of claim 12, wherein the application system represents a serial-data digital communication link.

16. A method comprising:
a) using a noise-measurement system to derive a plurality of signal samples on a first side of a spectrum boundary from a signal-under-test (SUT), each signal sample representing a value of phase noise in the SUT at a corresponding offset frequency;
b) creating estimated higher-frequency signal samples by determining a single value based on at least one of the signal samples in the plurality of signal samples, wherein the at least one of the signal samples is proximal to the spectrum boundary, and using the single value for all signal samples in the estimated higher-frequency signal samples to represent phase noise on a second side of the spectrum boundary;
c) filtering a set of signal samples created from the plurality of signal samples and the estimated higher-frequency signal samples in accordance with filter data representing filter characteristics of an application system; and
d) deriving a measure of noise from the filtered signal samples.

17. The method of claim 16, wherein the SUT represents a clock timing signal having an SUT clock frequency, and the spectrum boundary is located at an offset frequency equal to half of the SUT clock frequency.

18. The method of claim 17, wherein the application system comprises at least one phase locked loop (PLL).

19. The method of claim 18, wherein the single value represents one of: an average of signal samples in the plurality of signal samples, and the phase noise of the signal sample in the plurality of signal samples located at the highest offset frequency.

20. The method of claim 16, wherein the filtering occurs on the first side of the spectrum boundary.

21. The method of claim 16, wherein the single value represents the phase noise of the signal sample in the plurality of signal samples located at the highest offset frequency.

22. The method of claim 16, wherein the single value represents an average of signal samples in the plurality of signal samples.

23. The method of claim 16, wherein the noise-measurement system comprises a phase-noise analyzer.

24. The method of claim 16, wherein the application system represents a serial-data digital communication link, and the measure of noise represents time-interval error (TIE) jitter.

* * * * *